(12) United States Patent
Ishida

(10) Patent No.: US 12,191,152 B2
(45) Date of Patent: Jan. 7, 2025

(54) METHOD OF HELICAL CHAMFER MACHINING SILICON WAFER

(71) Applicant: SUMCO Corporation, Tokyo (JP)

(72) Inventor: Kentarou Ishida, Tokyo (JP)

(73) Assignee: SUMCO CORPORATION, Tokyo (JP)

(*) Notice: Subject to any disclaimer, the term of this patent is extended or adjusted under 35 U.S.C. 154(b) by 821 days.

(21) Appl. No.: 17/290,861

(22) PCT Filed: Oct. 4, 2019

(86) PCT No.: PCT/JP2019/039403
§ 371 (c)(1),
(2) Date: May 3, 2021

(87) PCT Pub. No.: WO2020/105298
PCT Pub. Date: May 28, 2020

(65) Prior Publication Data
US 2021/0327718 A1    Oct. 21, 2021

(30) Foreign Application Priority Data
Nov. 19, 2018    (JP) .................................. 2018-216585

(51) Int. Cl.
*H01L 21/304* (2006.01)
*B24B 9/06* (2006.01)
(Continued)

(52) U.S. Cl.
CPC ............ *H01L 21/304* (2013.01); *B24B 9/065* (2013.01); *B24B 47/25* (2013.01); *B24B 49/02* (2013.01);
(Continued)

(58) Field of Classification Search
CPC ........... B24B 7/228; B24B 9/06; B24B 9/065; B24B 9/08; B24B 9/00; B24B 49/02;
(Continued)

(56) References Cited

U.S. PATENT DOCUMENTS 5,045,505 A    9/1991  Kimura
5,110,764 A *  5/1992  Ogino ................. H01L 29/0661
                                                  451/63
(Continued)

FOREIGN PATENT DOCUMENTS

JP    2-291126 A    11/1990
JP    2007-165712 A    6/2007
(Continued)

OTHER PUBLICATIONS

Machine translation of JP-2018167331-A (Year: 2018).*
(Continued)

*Primary Examiner* — Robert F Neibaur
(74) *Attorney, Agent, or Firm* — GREENBLUM & BERNSTEIN, P.L.C.

(57) ABSTRACT

Provided is a method of chamfer machining a silicon wafer which makes it possible to increase the number of machining operations that can be performed using a chamfering wheel used for helical chamfer machining in the case of obtaining a small finished wafer taper angle. The method in which helical chamfer machining is performed so that the finished wafer taper angle θ of an edge portion in the one silicon wafer is within an allowable angle range of a target wafer taper angle $\theta_0$ includes a first truing step; a first chamfer machining step; a step of determining a groove bottom diameter $\phi_A$ of the fine grinding grindstone portion; a second truing step using a second truer taper angle $\alpha_2$; and a second chamfer machining step. The second truer taper angle $\alpha_2$ is made larger than the first truer taper angle $\alpha_1$.

8 Claims, 8 Drawing Sheets

(51) Int. Cl.
  *B24B 47/25* (2006.01)
  *B24B 49/02* (2006.01)
  *B24B 49/05* (2006.01)
  *B24B 49/18* (2006.01)
  *B24B 53/06* (2006.01)
  *B24B 53/07* (2006.01)
  *H01L 21/687* (2006.01)

(52) U.S. Cl.
  CPC ............ *B24B 49/05* (2013.01); *B24B 49/183* (2013.01); *B24B 53/06* (2013.01); *B24B 53/062* (2013.01); *B24B 53/07* (2013.01); *H01L 21/68764* (2013.01)

(58) Field of Classification Search
  CPC ....... B24B 49/18; B24B 49/183; B24B 49/04; B24B 49/05; B24B 47/25; B24B 53/07; B24B 53/062; H01L 21/304; H01L 21/67219; H01L 21/68771
  USPC ................ 451/41, 44, 56, 443, 254, 258
  See application file for complete search history.

(56) References Cited

U.S. PATENT DOCUMENTS

| | | | |
|---|---|---|---|
| 5,295,331 A * | 3/1994 | Honda | H01L 21/02021 451/5 |
| 7,189,149 B2 * | 3/2007 | Katayama | B24B 9/065 451/443 |
| 8,038,511 B2 * | 10/2011 | Yamazaki | B24B 53/07 125/11.18 |
| 8,231,430 B2 * | 7/2012 | Kato | B24B 49/18 451/21 |
| 9,293,318 B2 | 3/2016 | Yamashita | |
| 9,991,110 B2 | 6/2018 | Kozasa et al. | |
| 10,559,471 B2 | 2/2020 | Morikawa | |
| 10,971,351 B2 | 4/2021 | Yamashita | |
| 2009/0163119 A1 | 6/2009 | Yamazaki et al. | |
| 2020/0411391 A1 | 12/2020 | Nagasawa et al. | |

FOREIGN PATENT DOCUMENTS

| | | | | |
|---|---|---|---|---|
| JP | 2009-078326 A | | 4/2009 | |
| JP | 2018024031 A | * | 2/2018 | ............ B24B 49/02 |
| JP | 2018069391 A | * | 5/2018 | |
| JP | 2018167331 A | * | 11/2018 | |

OTHER PUBLICATIONS

Machine translation of JP-2018024031-A (Year: 2018).*
Machine translation of JP-2018069391-A (Year: 2018).*
International Preliminary Report on Patentability together with a Written Opinion of the International Searching Authority issued in International Bureau of Wipo Patent Application No. PCT/JP2019/039403, dated May 25, 2021, and English translation thereof.
International Search Report issued in International Bureau of WIPO Patent Application No. PCT/JP2019/039403, dated Dec. 17, 2019, and English translation thereof.
Chinese Office Action dated Nov. 30, 2022 issued by the Chinese Patent Office in the corresponding Chinese patent Application. No. 201980075940.8, together with an English-language translation.

* cited by examiner

METHOD OF HELICAL CHAMFER MACHINING SILICON WAFER

TECHNICAL FIELD

This disclosure relates to a method of helical chamfer machining a silicon wafer, and relates in particular to a helical chamfer machining method in which the target wafer taper angle of a silicon wafer edge portion is small.

BACKGROUND

Silicon wafers are widely used as substrates of semiconductor devices. A silicon wafer is obtained by performing lapping and mirror polishing on a wafer obtained by slicing a single crystal silicon ingot. Further, in order to prevent, for example, chipping of a silicon wafer being transferred, chamfering is typically performed on a wafer edge portion.

One known such chamfer machining method is a "helical chamfer machining method" in which chamfering is performed while inclining a chamfering wheel with respect to a silicon wafer in order to reduce the strain in a chamfered portion of a wafer edge portion, caused by machining. Referring to FIG. 1A and FIG. 1B, a typical helical chamfer machining method will be described. FIG. 1A is a perspective view schematically illustrating the positional relationship between a silicon wafer W and a chamfering wheel 10 during helical chamfer machining. FIG. 1B is a schematic cross-sectional view of the chamfering wheel 10 (illustrating a state where the wheel is horizontally set for brevity). FIG. 1B depicts the groove bottom diameter $\phi_A$ and the wheel diameter $\phi_B$ of the chamfering wheel 10. In the chamfering wheel 10, a fine grinding grindstone portion 10B (also referred to as a resin grindstone or a resin bond grindstone) is provided around a center portion 10A made of metal. The chamfering wheel 10 is rotated while being inclined at a predetermined angle $\psi$ with respect to the vertical direction (see FIG. 1A, in which the angle symbol $\psi$ is not shown). The fine grinding grindstone portion 10B is pressed against the silicon wafer W being rotated thereby performing finish chamfer machining (hereinafter simply "chamfer machining") on the edge portion of the silicon wafer W. Note that prior to the chamfer machining, the shape of the fine grinding grindstone portion 10B is formed by rough chamfer machining using a rough grinding grindstone.

To control the shape of the edge portion of the silicon wafer W so that the finished wafer has a desired finished wafer taper angle after the chamfer machining, truing is performed to form a groove shape of the fine grinding grindstone portion 10B in the groove chamfering wheel 10. The truing is typically performed by the following procedure. First, a truer having a predetermined truer taper angle is designed and produced so that the finished taper angle of the edge portion of the finished silicon wafer W to be finally obtained is within the allowable angle range of the target wafer taper angle. Using this truer, the groove portion in the fine grinding grindstone portion 10B of the chamfering wheel 10 is machined by pressing and rotating the truer and the chamfering wheel 10 against each other with the machining axis of the chamfering wheel 10 being inclined at a predetermined angle $\psi$ with respect to the vertical direction. Thus, the shape of an edge portion of the truer is transferred to the groove portion of the fine grinding grindstone portion 10B.

Accordingly, the shape of the chamfer portion of the silicon wafer W depends on the groove shape of the fine grinding grindstone portion 10B reflecting the truer taper angle and the inclination of the machining axis of the chamfering wheel (inclination angle $\psi$). In the helical chamfer machining method, the exact groove shape of the fine grinding grindstone portion 10B is not simply transferred to the edge portion of the finished silicon wafer. Given this situation, to obtain the desired finished shape, it is necessary that the chamfering shape of the truer be suitably formed so as to appropriately adjust the groove shape of the fine grinding grindstone portion 10B.

For example, JP 2007-165712 A (PTL 1) discloses the following method for machining a chamfer portion of a semiconductor wafer. In a method for subjecting a roughly ground chamfer portion of a semiconductor wafer to precise machining of grinding by relatively inclining the wafer and a second grinding stone to perform machining, an edge portion of a discoid truer is formed into a vertically asymmetrical groove shape of a first grinding stone by using the first grinding stone having a vertically asymmetrical groove formed on a periphery thereof to grind the edge portion of the truer with the groove of the first grinding stone; a groove is formed on a periphery of the second grinding stone by grinding the second grinding stone while relatively inclining the truer and the second grinding stone; and precisely grinding the chamfer portion of the semiconductor wafer while relatively inclining the wafer with respect to a direction of the groove formed on the periphery of the second grinding stone.

In the machining method of PTL 1, since the vertical symmetry of the wafer chamfer portion is lost by performing helical chamfer machining, to prevent this, a rough grinding grindstone (first grinding stone) having a vertically asymmetrical groove shape is used to form a groove shape reflecting the above groove shape on a fine grinding grindstone (second grinding stone).

CITATION LIST

Patent Literature

PTL 1: JP 2007-165712 A

SUMMARY

Technical Problem

In recent years, the chamfer shape of a silicon wafer edge portion is required to meet a variety of specifications. There is also a demand that the finished wafer taper angle of an edge portion of a silicon wafer be an angle smaller than conventional angles (nearly horizontal taper). The inventor of this disclosure first diligently studied to determine whether such a small finished wafer taper angle can be achieved or not.

The inventor first attempted to use a truer having a chamfering shape of a small truer taper angle so that the finished wafer taper angle of the edge portion of a silicon wafer be a taper angle (hereinafter also abbreviated as "small taper angle") smaller than conventional angles. Assuming quantity production, using this truer, a fine grinding grindstone portion of a chamfering wheel was trued, and helical chamfer machining was performed on a silicon wafer using the trued fine grinding grindstone portion. Thereupon, the inventor found that there were cases where the desired small finished wafer taper angle was not obtained and those where the desired angle was obtained. More detailed studies showed that when a truer was used, although the desired finished wafer taper angle was not obtained in the early stages of use of the fine grinding grindstone, the desired finished wafer taper angle was obtained in the final stages of use of the fine grinding grindstone in some cases. Further, when a truer having a different truer taper angle was used, although the desired finished wafer taper angle was obtained in the early stages of use of the fine grinding grindstone, it gradually became impossible to obtain the desired finished wafer taper angle in some cases. More detailed analyses demonstrated that the desired finished wafer taper angle was obtained when the groove bottom diameter $\phi_A$ of the chamfering wheel (see FIG. 1B) was within a predetermined range. From these experimental facts, the inventor found that in order to obtain a small finished wafer taper angle, merely using a truer having a certain truer taper angle is not sufficient, and the groove bottom diameter $\phi_A$ of the chamfering wheel needs to be reduced to the predetermined range. Thus, in cases where a truer having a certain truer taper angle is used, the desired small taper angle cannot be obtained unless the groove bottom diameter $\phi_A$ of the chamfering wheel is reduced to the predetermined range, whereas when the groove bottom diameter $\phi_A$ of the chamfering wheel is excessively reduced due to repeated chamfer machining and deviates from the above predetermined range, the desired small taper angle still cannot be obtained. Accordingly, when the finished wafer taper angle is made to be a small taper angle, it is necessary to frequently replace the chamfering wheel.

Note that when a conventional finished wafer taper angle is obtained, the groove bottom diameter $\phi_A$ of the chamfering wheel rarely affects the finished wafer taper angle. Accordingly, in the case of obtaining a conventional finished wafer taper angle, one chamfering wheel can be used from start to finish of the use of the fine grinding grindstone.

As described above, in order to obtain a silicon wafer having a small finished wafer taper angle, merely using a truer having a certain truer taper angle leads to a number of machining operations that can be performed using one chamfering wheel (wheel life) that is significantly smaller than the number in conventional techniques. An increase in the replacement frequency of the chamfering wheel greatly affects the production cost of quantity production. This is a problem newly recognized by the inventor.

It could therefore be helpful to provide a method of chamfer machining a silicon wafer which makes it possible to increase the number of machining operations that can be performed by a chamfering wheel used for helical chamfer machining in the case of obtaining a small finished wafer taper angle.

Solution to Problem

The inventor diligently studied to solve the above problems. As a result, the inventor found that in order to obtain a finished wafer taper angle within an allowable angle range of the target wafer taper angle, the number of machining operations that can be performed using a chamfering wheel can be increased by using different truer taper angles depending on the groove bottom diameter of the chamfering wheel. This disclosure is based on the above findings, and we propose the following features.

(1) A method of helical chamfer machining silicon wafers, comprising performing helical chamfer machining on a plurality of silicon wafers in succession, the helical chamfer machining being performed by, while rotating a chamfering wheel provided with a fine grinding grindstone portion with the rotation angle being inclined with respect to the vertical direction, pressing one silicon wafer being rotated against the fine grinding grindstone portion so that a finished wafer taper angle of an edge portion in the one silicon wafer is within an allowable angle range of a target wafer taper angle, the method further comprising:

a first truing step of truing the fine grinding grindstone portion of the chamfering wheel using a truer having a first truer taper angle;

a first chamfer machining step of helical chamfer machining a first silicon wafer using the fine grinding grindstone portion having been subjected to the first truing step so that a finished wafer taper angle of the machined first silicon wafer is within the allowable angle range of the target wafer taper angle;

a step of determining a groove bottom diameter of the grindstone portion after the first chamfer machining step;

a second truing step of truing the fine grinding grindstone portion of the chamfering wheel using a truer having a second truer taper angle when the groove bottom diameter is smaller than a predetermined threshold value; and a second chamfer machining step of helical chamfer machining a second silicon wafer using the fine grinding grindstone portion having been subjected to the second truing step so that a finished wafer taper angle of the machined second silicon wafer is within the allowable angle range of the target wafer taper angle, wherein the second truer taper angle is larger than the first truer taper angle.

Here, referring to FIGS. 2A and 2B, a wafer taper angle $\theta$ of an edge portion of a silicon wafer W in this specification will be described. FIG. 2A illustrates the thickness t of the peripheral portion of the wafer, the top chamfer angle $\theta_1$, the bottom chamfer angle $\theta_2$, and the chamfer width A. The dimensions $B_1$ and $B_2$ represent the top chamfer thickness and the bottom chamfer thickness, respectively. BC represents the length of the end face in the wafer thickness direction, and the wafer thickness direction length BC of the end face of the chamfer shape illustrated in FIG. 2A is zero. The shape of the wafer periphery when the wafer thickness direction length BC is not zero is illustrated in FIG. 2B. In either shape of the edge portion in FIGS. 2A and 2B, both the top chamfer angle $\theta_1$ and the bottom chamfer angle $\theta_2$ correspond to the wafer taper angle $\theta$. This definition hereinafter also applies to cases where the wafer taper angle $\theta$ is followed by a subscript. Unless otherwise specified, a wafer taper angle refers to the wafer taper angle of either the top surface and the bottom surface.

Further, referring to FIG. 3, a truer taper angle $\alpha$ in this specification will be described. An edge portion of a truer 3 has a chamfer (inclined surface) 3A and an end portion 3B that forms a curved surface (typically a parabolic surface). Here, the angle formed between the chamfer 3A of the truer 3 and a main surface of the truer is defined as a truer taper angle $\alpha$. This definition also applies to cases where the truer taper angle $\alpha$ is followed by a subscript. The truer 3 has abrasive grains in the end portion 3B that forms a curved surface, and machining is performed along the curved surface.

(2) The method of helical chamfer machining silicon wafers, according to (1) above, wherein the target wafer taper angle is 23° or less.

(3) The method of helical chamfer machining silicon wafers, according to (1) or (2) above, wherein a difference between the first truer taper angle and the second truer taper angle is equal to or larger than 1°.

(4) The method of helical chamfer machining silicon wafers, according to any one of (1) to (3) above, further comprising an adjustment step of adjusting the groove bottom diameter by wearing down the fine grinding grindstone portion.

Advantageous Effect

This disclosure can provide a method of chamfer machining a silicon wafer which makes it possible to increase the number of machining operations that can be performed using a chamfering wheel used for helical chamfer machining even in the case of obtaining a small finished wafer taper angle.

DETAILED DESCRIPTION

Figure 1A:
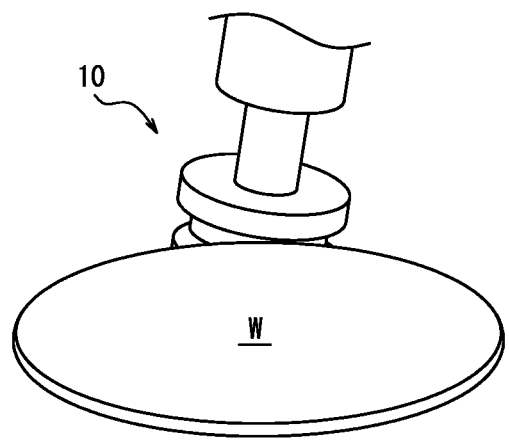
FIG. 1A is a perspective view illustrating a typical helical chamfer machining method.

Prior to describing embodiments in detail, first, experiments which led to the completion of this disclosure is described. For convenience of description, this experiment is described referring to the reference numerals in FIG. 6 and FIG. 7.

EXPERIMENTS

Experiment 1

As a truer 31, a GC truer #320 (truer taper angle: 24°, diameter: 301 mm) manufactured by TOSEI ENGINEERING CORP. was prepared. A chamfering wheel 10 (wheel diameter $\phi_3$: 50.0 mm, initial groove bottom diameter $\phi_4$: 47.0 mm) having a resin grindstone as a fine grinding grindstone portion 10B was inclined at 8° with respect to the vertical direction, and a groove portion of the fine grinding grindstone portion 10B was trued using the above truer 31. With the chamfering wheel 10 being inclined at 8° with respect to the vertical direction, while a silicon wafer $W_A$ having a diameter of approximately 300 mm and the chamfering wheel 10 were separately rotated, the groove portion of the fine grinding grindstone portion 10B of the chamfering wheel 10 was pressed against the silicon wafer, thus helical chamfer machining on an edge portion of the silicon wafer $W_A$ was performed. Further, the wafer taper angle $\theta_A$ of the silicon wafer $W_A$ having been subjected to helical chamfer machining was measured using an edge profile monitor (LEP-2200) manufactured by Kobelco Research Institute, Inc. Moreover, the groove bottom diameter $\phi_A$ of the chamfering wheel 10 after the helical chamfer machining was measured using W-GM-5200 manufactured by TOSEI ENGINEERING CORP. The above-described truing, helical chamfer machining, and measurements were successively repeated, and the relationship between the groove bottom diameter $\phi_A$ and the wafer taper angle $\theta_A$ was determined. The results are given in the graph of FIG. 4. Note that the graph illustrates the finished wafer taper angle of the front side of the silicon wafer and the finished wafer taper angle of the back side thereof. This also applies to Examples 2 to 6 below.

Examples 2-6

Truing, helical chamfer machining, and measurements were successively repeated as in Experiment 1 except that the truer taper angle 24° of the truer in Experiment 1 above was changed to 22° (Experiment 2), 20° (Experiment 3), 18° (Experiment 4), 16° (Experiment 5), and 14° (Experiment 6); and the relationship between the groove bottom diameter $\phi_A$ and the wafer taper angle $\theta_A$ was determined. The results are given in the graph of FIG. 4.

<Considerations>

From the experimental results of Experiments 1 to 6 above, we found the following. First, when the target wafer taper angle $\theta_0$ is larger than 23°, in order to obtain a finished wafer taper angle θ within an allowable angle range of the target wafer taper angle $\theta_0$, the truer taper angle may only be optimized. For example, when the target wafer taper angle $\theta_0$ is 24°, the allowable angle range is ±0.5°, a truer 31 having a truer taper angle of 22° may be used. In this case, the groove bottom diameter $\phi_A$ has little impact. This experimental fact agrees with the fact that in conventional techniques, the chamfering wheel 10 can be used throughout the wheel life.

On the other hand, when the target wafer taper angle $\theta_0$ is a given angle equal to or less than 23° (for example, 20° or 18°), as the groove bottom diameter $\phi_A$ is reduced, the actual finished wafer taper angle θ after machining is reduced, and the change gradually tends to be saturated. If truing and helical chamfer machining are repeated with the truer taper angle being fixed, when the groove bottom diameter $\phi_A$ is not within an appropriate range, the finished wafer taper angle θ would deviate from the allowable angle range of the target wafer taper angle $\theta_0$. Accordingly, when the truer taper angle is fixed, a chamfering wheel cannot be used throughout its wheel life unlike in the case where the target wafer taper angle $\theta_0$ is larger than 23°.

When helical chamfer machining is performed after the groove bottom diameter $\phi_A$ is reduced to the extent that changes in the difference between the target wafer taper angle $\theta_0$ and the finished wafer taper angle θ saturate, the desired finished wafer taper angle θ can be consistently obtained. For example, when the target wafer taper angle $\theta_0$ is 18° and the allowable angle range is ±0.5°, the finished wafer taper angle θ after machining satisfies 18°±0.5° if machining is performed under a condition of a truer taper angle of 16° after the groove bottom diameter $\phi_A$ is reduced to approximately 45.2 mm. However, this condition corresponds to the late stage of the chamfering wheel life, so that the chamfering wheel is required to be replaced early. With this in mind, in order to use a chamfering wheel through most of the wheel life, the inventor contemplated using different truer taper angles depending on the groove bottom diameter $\phi_A$ so that the finished wafer taper angle θ is within the allowable angle range of the target wafer taper angle $\theta_0$. Referring to the above specific example, a truer having a truer taper angle of 14° is used first, and after the groove bottom diameter $\phi_A$ is reduced, a truer having a truer taper angle of 16° is used, so that the wheel life range can be used more efficiently than the case of using only one truer having a certain truer taper angle.

Thus, the inventor contemplated setting a threshold value for groove bottom diameter $\phi_A$ of the chamfering wheel 10 and using different truer taper angles depending on the groove bottom diameter $\phi_A$. Embodiments of this disclosure will now be described with reference to FIGS. 5 to 9. FIGS. 5 to 9 illustrate main components of this disclosure, and a support for rotating constituent components, a rotating mechanism, etc. are omitted in the diagrams for convenience of description.

(Method of Chamfer Machining Silicon Wafer)

A method of chamfer machining a silicon wafer, according to one embodiment of this disclosure includes performing helical chamfer machining on a plurality of silicon wafers in succession, the helical chamfer machining being performed by, while rotating a chamfering wheel 10 provided with a fine grinding grindstone portion 10B with the rotation angle being inclined with respect to the vertical direction, pressing one silicon wafer being rotated against the fine grinding grindstone portion 10B so that the finished wafer taper angle θ of an edge portion in the one silicon wafer is within an allowable angle range of a target wafer taper angle $\theta_0$. Note that the "plurality of silicon wafers" herein refers to silicon wafers of the same type (wafers of which wafer characteristics do not substantially affect the shape obtained by helical chamfer machining, for example, silicon wafers in the same lot) that are subjected to a series of chamfer machining steps according to this method of machining. A first silicon wafer $W_A$ and a second silicon wafer $W_B$ to be described are silicon wafers of the same type in this sense. The target wafer taper angle $\theta_0$ in this method is particularly preferably 23° or less. As can be seen in the above experimental results, in chamfer machining in which the target wafer taper angle $\theta_0$ is 23° or less, dependence of the groove bottom diameter $\phi_A$ is observed. Further, the target wafer taper angle $\theta_0$ and its allowable angle range are determined as appropriate depending on the product specifications. Depending on the product specifications, the allowable angle range that is the difference between the finished wafer taper angle θ and the target wafer taper angle $\theta_0$ can be determined as appropriate within, for example, ±0.1° to ±1.0°.

Figure 5:
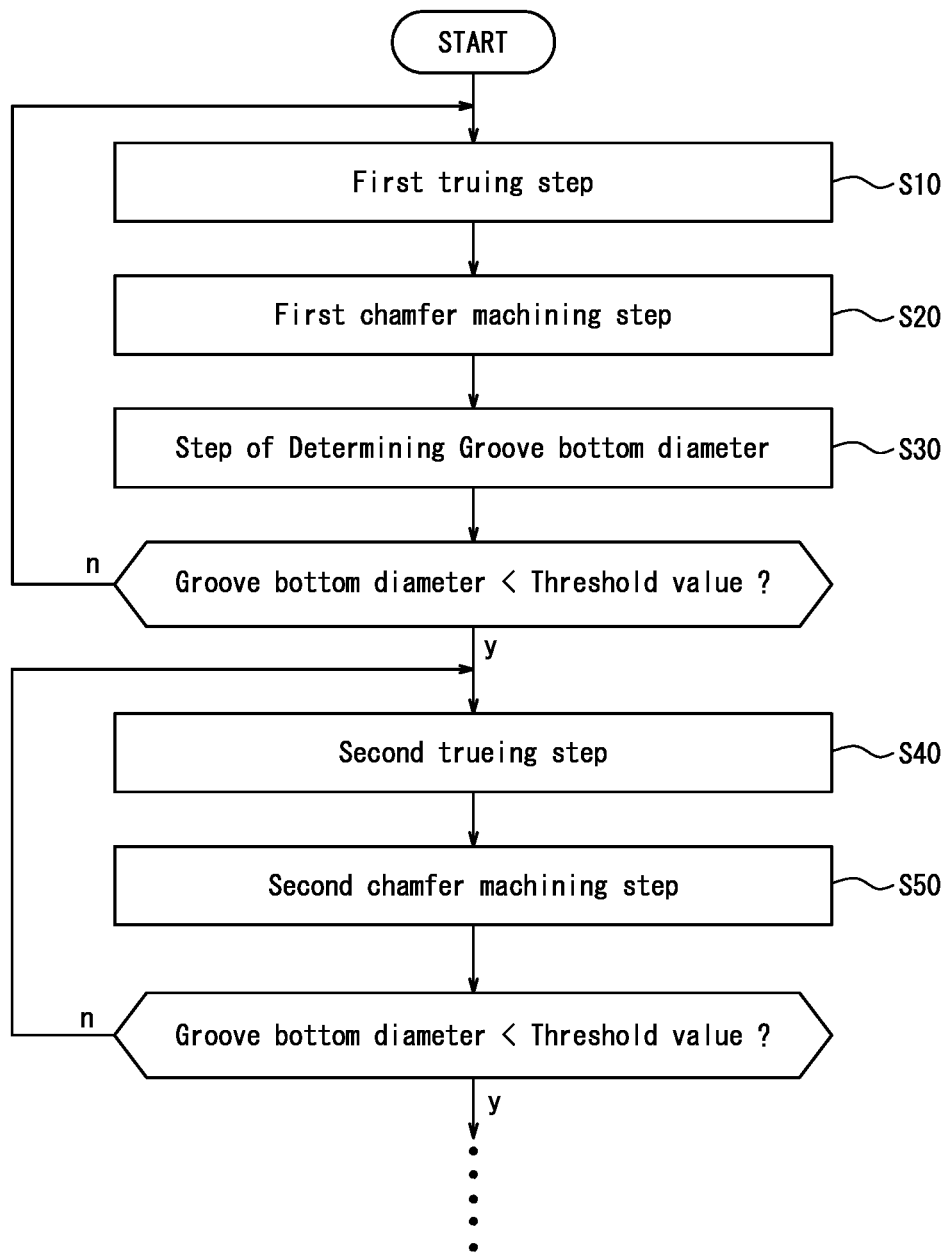
FIG. 5 is a flowchart of a method of chamfer machining a silicon wafer, according to one embodiment of this disclosure.

Reference is made to the flowchart in FIG. 5. The method includes: a first truing step S10 of truing the fine grinding grindstone portion 10B of the chamfering wheel 10 using a first truer 31 having a first truer taper angle $\alpha_1$; a first chamfer machining step S20 of helical chamfer machining a first silicon wafer $W_A$ using the fine grinding grindstone portion 10B having been subjected to the first truing step S10 so that a finished wafer taper angle $\theta_A$ of the machined first silicon wafer $W_A$ is within the allowable angle range of the target wafer taper angle $\theta_0$; a step S30 of determining a groove bottom diameter $\phi_A$ of the fine grinding grindstone portion 10B after the first chamfer machining step S20; a second truing step S40 of truing the fine grinding grindstone portion 10B of the chamfering wheel 10 using a second truer 32 having a second truer taper angle $\alpha_2$ when the groove bottom diameter $\phi_A$ is smaller than a predetermined threshold value $\phi_0$; and a second chamfer machining step S50 of helical chamfer machining a second silicon wafer $W_B$ using the fine grinding grindstone portion 10B having been subjected to the second truing step S40 so that a finished wafer taper angle $\theta_B$ of the machined second silicon wafer $W_B$ is within the allowable angle range of the target wafer taper angle $\theta_0$. In this method, in the second truing step, a truer having a taper angle that is larger than the taper angle $\alpha_1$ of the first truer used in the first truing step is used as the second truer. The details of the constituent elements and steps will now be described in succession.

<First Truing Step>

Figure 6:
FIG. 6 is a schematic cross-sectional view illustrating a first truing step.
Figure 6:
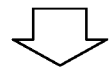
Figure 6:
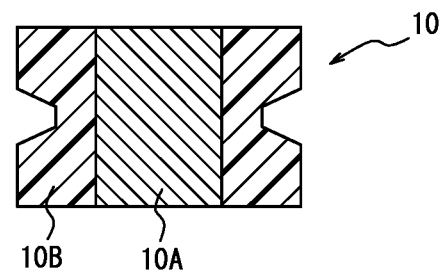
Figure 6:
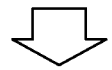
Figure 6:
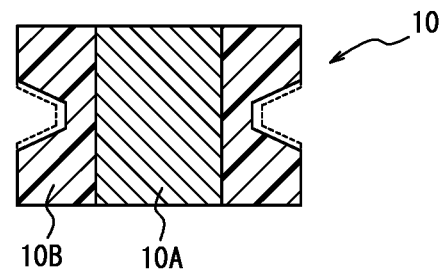

Referring to FIG. 6, the first truing step S10 will be described. First, the first truer 31 having the first truer taper angle $\alpha_1$ is prepared (see Step S11 in FIG. 6). The first truer taper angle $\alpha_1$ can have any given magnitude as long as the next first chamfer machining step can be performed so that the finished wafer taper angle $\theta_A$ can be within the allowable angle range of the target taper angle $\theta_0$. The first truer taper angle $\alpha_1$ may be selected depending on the target wafer taper angle $\theta_0$ and the groove bottom diameter $\phi_A$. Typically, the magnitude of the first truer taper angle $\alpha_1$ is set to be smaller than the target wafer taper angle $\theta_0$ by 2.0° or more.

The fine grinding grindstone portion 10B is trued using the first truer 31 while the chamfering wheel 10 is inclined at a predetermined wheel inclination angle. A shape reflecting the edge portion of the first truer 31 is formed on the fine grinding grindstone portion 10B by shape transferring. Referring to Steps S12 and S13 in FIG. 6, the broken line in S13 corresponds to the groove of the fine grinding grindstone portion 10B in S12 before truing. As the chamfering wheel 10, one typically used for helical chamfer machining can be used. A rotation axis portion (center portion) 10A is typically made of metal such as aluminum or stainless steel, and the fine grinding grindstone portion 10B is provided around the rotation axis portion. The fine grinding grindstone portion 10B is typically made of synthetic resin (the fine grinding grindstone is also called a resin grindstone, a resin bond grindstone, etc.). The rotation axis portion 10A of the chamfering wheel is provided with a hollow portion for a rotation axis; however, the hollow portion is, for brevity, not shown in the diagram.

<First Chamfer Machining Step>

Figure 1B:
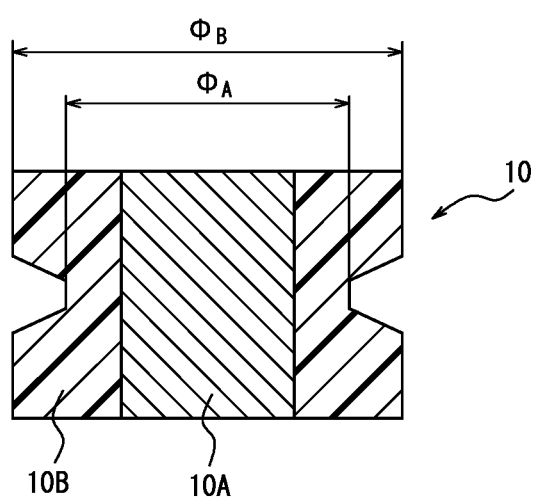
FIG. 1B is a schematic cross-sectional view of a chamfering wheel in FIG. 1A.
Figure 2A:
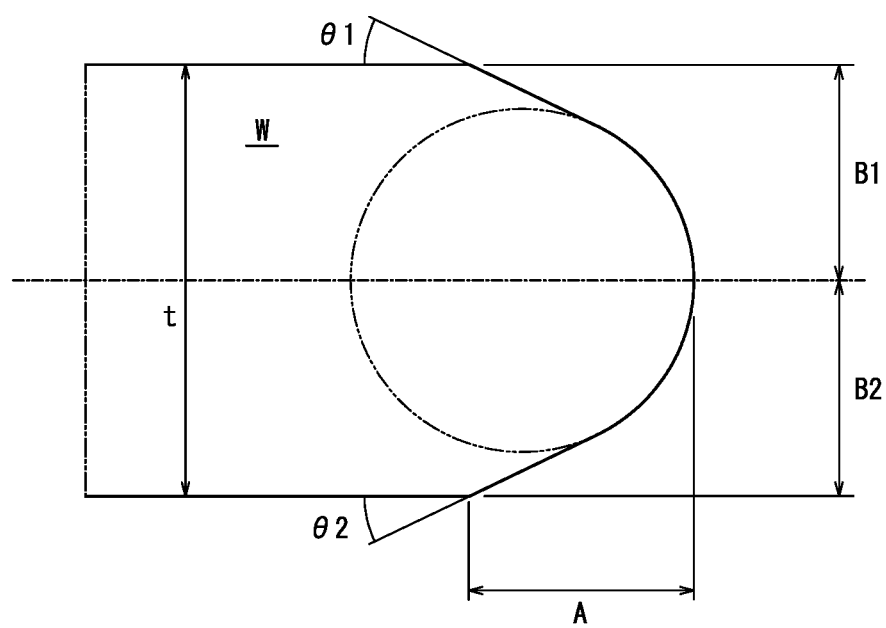
FIG. 2A is an example schematic cross-sectional view illustrating a wafer taper angle θ of a silicon wafer in this specification.
Figure 2B:
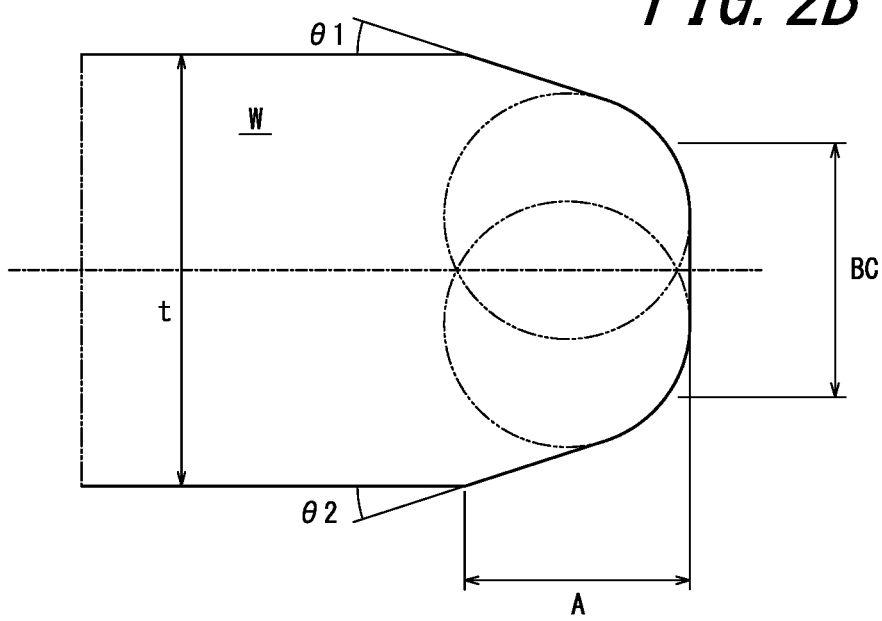
FIG. 2B is another example schematic cross-sectional view illustrating a wafer taper angle θ of a silicon wafer in this specification.
Figure 3:
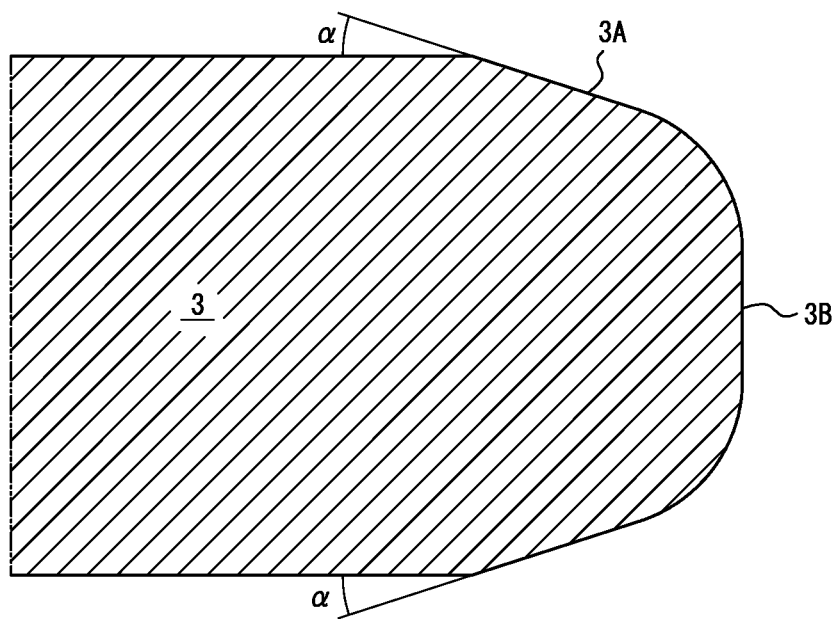
FIG. 3 is a schematic cross-sectional view illustrating a truer taper angle α of a truer in this specification.
Figure 7:
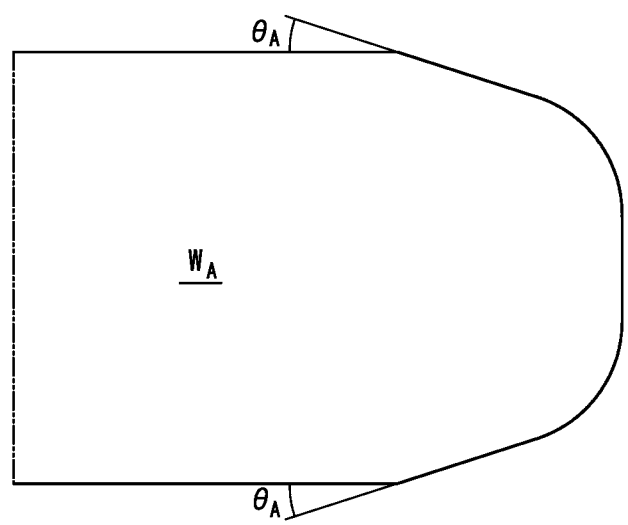
FIG. 7 is a schematic cross-sectional view illustrating a wafer taper angle of a silicon wafer having been subjected to a first chamfer machining step.

Next, in the first chamfer machining step S20 subsequent to the first truing step S10, the silicon wafer $W_A$ is subjected to helical chamfer machining using the fine grinding grindstone portion 10B having the shape transferred via the first truer 31 in the first truing step S10. In helical chamfer machining, as described with reference to FIG. 1, the first silicon wafer $W_A$ is subjected to helical chamfer machining by pressing and rotating the first silicon wafer $W_A$ against the fine grinding grindstone portion 10B with the chamfering wheel 10 being inclined at the wheel inclination angle ψ. Thus, the helical chamfer machining is performed so that the finished wafer taper angle $\theta_A$ of the machined first silicon wafer $W_A$ is within the allowable angle range of the target wafer taper angle $\theta_0$. FIG. 7 illustrates the finished wafer taper angle $\theta_A$ of the thus formed first silicon wafer $W_A$. The wheel inclination angle ψ of the chamfering wheel 10 is appropriately set within a range of 4° to 15°. Under normal conditions, the wheel inclination angle during truing and the wheel inclination angle during chamfer machining are the same.

<Step of Determining Groove Bottom Diameter $\phi_A$>

As described above, since the fine grinding grindstone portion 10B is typically made of synthetic resin, the groove portion of the fine grinding grindstone portion 10B wears down through truing and helical chamfer machining. Accordingly, in this step S30 of determining the groove bottom diameter $\phi_A$, the groove bottom diameter $\phi_A$ of the fine grinding grindstone portion 10B after the first chamfer machining step S20 is determined. The groove bottom diameter $\phi_A$ may be measured after performing helical chamfer machining a plurality of times (100 times, 1000 times, etc.) in a series in the first chamfer machining step; alternatively, the groove bottom diameter $\phi_A$ may be measured every time after performing helical machining. Thus, the groove bottom diameter $\phi_A$ may be measured with appropriate timing. Moreover, the amount of wear caused by the machining performed the plurality of times of machining may be previously determined, and the groove bottom diameter $\phi_A$ may be measured after the machining is performed a predetermined number of times. The groove bottom diameter $\phi_A$ can be measured using a wheel groove diameter measuring device or a vernier caliper included in a chamfer machining apparatus (for example, W-GM-5200 manufactured by TOSEI ENGINEERING CORP. mentioned above).

<Second Truing Step>

Figure 8:
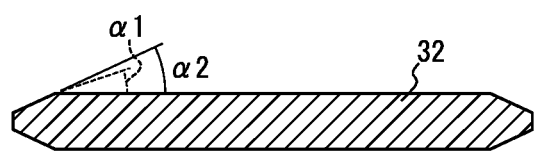
FIG. 8 is a schematic cross-sectional view illustrating a truer 32 used in a second truing step.

As described above with reference to Experiment 1 to Experiment 6, the continued use of a truer having a predetermined truer taper angle to obtain the wafer taper angle $\theta_0$ in early helical chamfer machining gradually reduces the finished wafer taper angle $\theta$ as the groove bottom diameter $\phi_A$ of the fine grinding grindstone portion 10B decreases, which results in a deviation from the intended finished wafer taper angle $\theta$. Accordingly, the difference between the finished wafer taper angle $\theta$ and the target wafer taper angle $\theta_0$ gradually becomes larger and deviates from the allowable angle range. To address this problem, when the groove bottom diameter $\phi_A$ is smaller than the threshold value $\phi_0$ previously determined in Step S30, the second truing step S40 is performed under conditions different from the conditions in the first truing step S10. As illustrated in FIG. 8, the second truer 32 having the second truer taper angle $\alpha_2$ is prepared, and the fine grinding grindstone portion 10B of the chamfering wheel 10 is trued using the second truer 32 in the second truing step S40. The threshold value $\phi_0$ may be determined by experimentally determining the correlation between the groove bottom diameter $\phi_A$ and the first truer taper angle $\alpha_1$, and the finished wafer taper angle $\theta$ actually formed by machining in advance.

Here, in order to obtain the desired finished wafer taper angle $\theta_B$ in the second chamfer machining step S50 to be performed later, the second truer taper angle $\alpha_2$ is required to be larger than the first truer taper angle $\alpha_1$ (second truer taper angle $\alpha_2$>first truer taper angle $\alpha_1$). In this respect, the truing conditions in the second truing step are different from the truing conditions in the first truing step. The other truing conditions are preferably the same in the first truing step and the second truing step, yet may be appropriately changed as long as the changes do not greatly affect the finished wafer taper angle.

Figure 4:
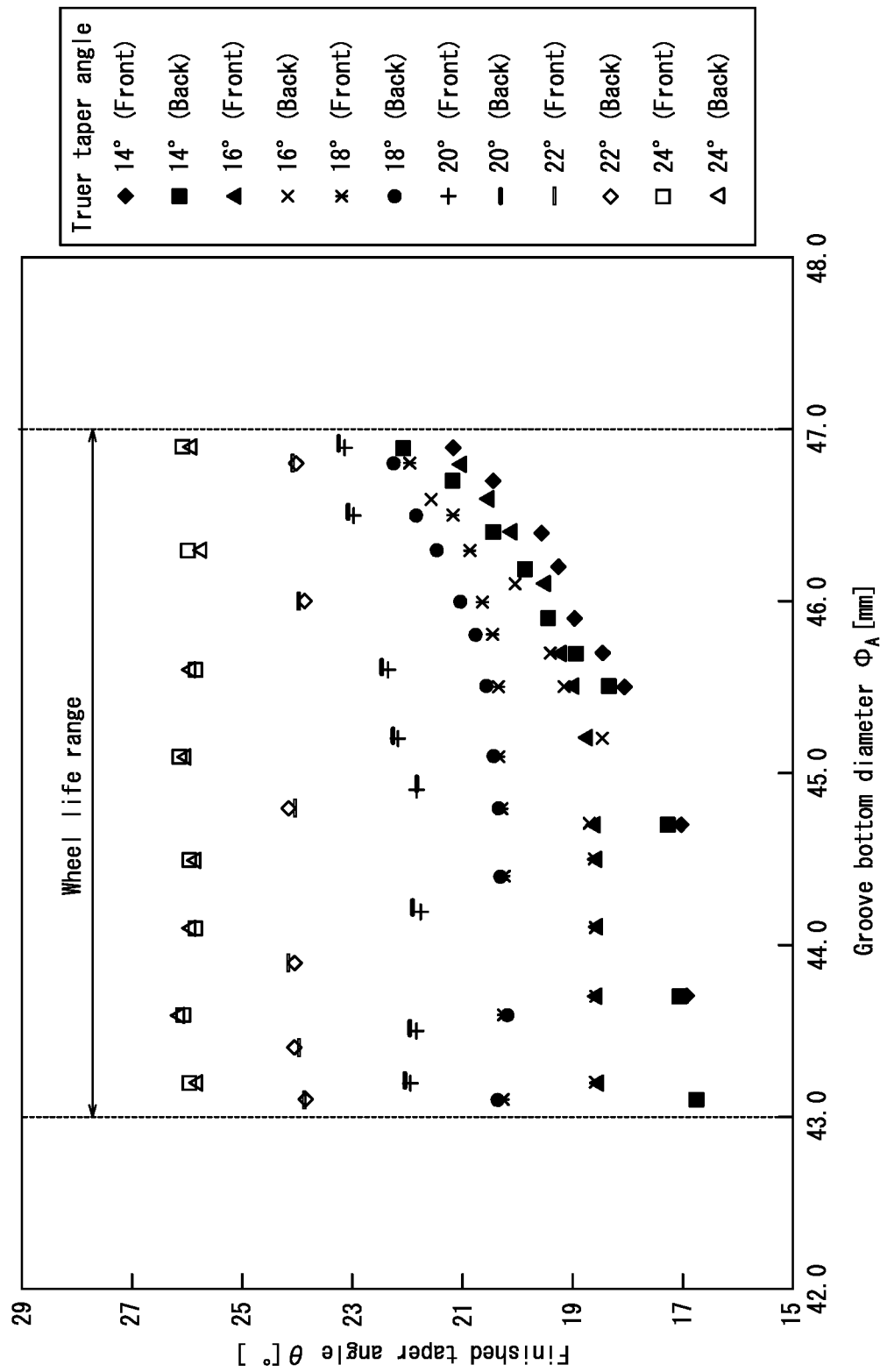
FIG. 4 is a graph illustrating the relationship between the groove bottom diameter of a fine grinding grindstone and the truer taper angle, and the finished wafer taper angle of a silicon wafer in an experiment performed by the inventor.

As depicted in the specific experimental results in FIG. 4, considering the dependence between the truer taper angle and the groove bottom diameter, the difference between the first truer taper angle $\alpha_1$ and the second truer taper angle $\alpha_2$ is preferably 1° or more, more preferably 2° or more. The upper limit of the difference may be for example set to, but not limited to, 6° or less.

<Second Chamfer Machining Step>

Figure 9:
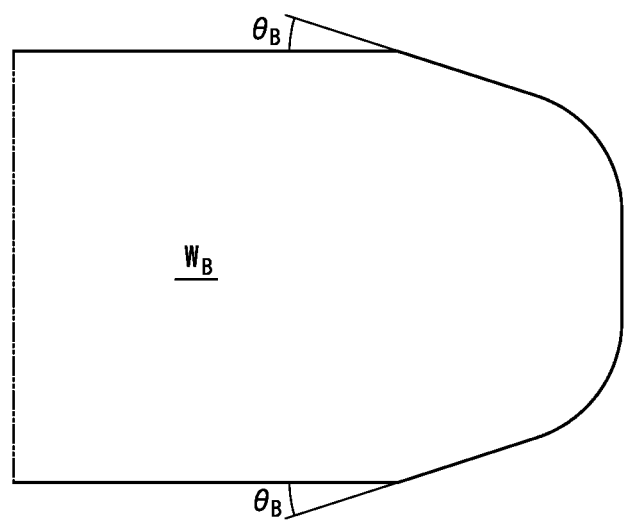
FIG. 9 is a schematic cross-sectional view illustrating the wafer taper angle of a silicon wafer having been subjected to a second chamfer machining step.

As with the first chamfer machining step S20, the second silicon wafer $W_B$ is subjected to helical chamfer machining using the fine grinding grindstone portion 10B having been subjected to the second truing step S40. Thus, the helical chamfer machining is performed so that the finished wafer taper angle $\theta_B$ of the machined second silicon wafer $W_B$ is within the allowable angle range of the target wafer taper angle $\theta_0$. FIG. 9 illustrates the finished wafer taper angle $\theta_B$ of the second silicon wafer $W_B$. In this method, although the chamfering wheel 10 is trued using truers having different truer taper angles in the first truing step and the second truing on purpose, the finished wafer taper angles $\theta_A$ and $\theta_B$ can be made within the allowable angle range of the target wafer taper angle $\theta_0$.

As described above, in this disclosure, different truer taper angles are used depending on the groove bottom diameter $\phi_A$ of the chamfering wheel 10 through Step S10 to Step S50. This allows both the finished wafer taper angle $\theta_A$ of the first silicon wafer $W_A$ and the finished wafer taper angle $\theta_B$ of the second silicon wafer $W_B$ to be controlled within the allowable angle range of the target wafer taper angle $\theta_0$, and increases the number of machining operations that can be performed using the chamfering wheel used for helical chamfer machining (wheel life).

Depending on the relationship between the groove bottom diameter $\phi_A$ and the truer taper angle, it is difficult to make the finished wafer taper angle within the allowable range of the target wafer taper angle in some cases. In such a case, an adjustment step of adjusting the groove bottom diameter $\phi_A$ by wearing down the fine grinding grindstone portion 10B. Wearing down herein includes not only the wear due to truing but also the wear due to chamfer machining on a silicon wafer for which another target wafer taper angle is set. This prevents a waste of the chamfering wheel life.

Further, as illustrated in the flowchart in FIG. 5, in this method, a third truing step and a third chamfer machining, etc. may be performed using a third truer (even a fourth truer) after setting another threshold value (for each set of steps). As the groove bottom diameter $\phi_A$ is reduced, using a truer having a larger truer taper angle can sufficiently efficiently use the wheel life range.

Specific aspects of a silicon wafer that can be used in this disclosure will be described below; however, they are not intended to limit this disclosure.

The silicon wafer may have a given crystallographic plane; for example, a (100) wafer may be used, or a (110) wafer may be used.

The silicon wafer may be doped with a dopant such as boron (B), phosphorus (P), arsenic (As), antimony (Sb), and may be doped with carbon (C), nitrogen (N), etc. to obtain desired characteristics. Further, the silicon wafer may have a given oxygen concentration.

The diameter of the silicon wafer to be subjected to machining is not limited in any way. This disclosure can be applied to silicon wafers having a typical diameter, for example, a diameter of 300 mm or 200 mm. Of course, this disclosure can be applied to silicon wafers having a diameter larger than 300 mm and to silicon wafers having a diameter smaller than 300 mm.

A "silicon wafer" herein refers to a so-called "bulk" silicon wafer, on the surface of which a layer, for example, an epitaxial layer or an insulating film made of for example silicon oxide is not formed. Note however that a natural oxide layer formed to a thickness of approximately several angstroms may be tolerated. Further, another layer such as an epitaxial layer may be additionally formed on the silicon wafer obtained by this disclosure to obtain an epitaxial silicon wafer; alternatively, for example, a silicon on insulator (SOI) wafer may be fabricated using the silicon wafer obtained as a support substrate of a bonded wafer or an active layer substrate. A "bulk" silicon wafer serving as a base substrate of such a wafer corresponds to a silicon wafer in this specification.

INDUSTRIAL APPLICABILITY

This disclosure provides a method of chamfer machining a silicon wafer which makes it possible to increase the number of machining operations that can be performed using a chamfering wheel used for helical chamfer machining in the case of obtaining a small finished wafer taper angle.

REFERENCE SIGNS LIST

10: Chamfering wheel
10A: Center portion
10B: Fine grinding grindstone portion
31: First truer
32: Second truer
W: Silicon wafer
$W_A$: First silicon wafer
$W_B$: Second silicon wafer
$\alpha_1$: First truer taper angle
$\alpha_2$: Second truer taper angle
$\phi_A$: Groove bottom diameter
$\phi_B$: Wheel diameter
$\phi_0$: Threshold value of groove bottom diameter
$\theta$, $\theta_A$, $\theta_B$: Finished wafer taper angle

The invention claimed is:

1. A method of helical chamfer machining silicon wafers, comprising performing helical chamfer machining on a plurality of silicon wafers in succession, the helical chamfer machining being performed by, while rotating a chamfering wheel provided with a fine grinding grindstone portion with a rotation angle being inclined with respect to the vertical direction, pressing one silicon wafer being rotated against the fine grinding grindstone portion so that a finished wafer taper angle of an edge portion in the one silicon wafer is within an allowable angle range of a target wafer taper angle, the method further comprising:
  firstly truing the fine grinding grindstone portion of the chamfering wheel using a first truer having a first truer taper angle;
  firstly helical chamfer machining a first silicon wafer of the plurality of silicon wafers using the fine grinding grindstone portion having been subjected to the firstly truing so that a finished wafer taper angle of the machined first silicon wafer is within the allowable angle range of the target wafer taper angle;
  directly measuring a groove bottom diameter of the fine grinding grindstone portion after the firstly helical chamfer machining;
  secondly truing the fine grinding grindstone portion of the chamfering wheel using a second truer having a second truer taper angle when the groove bottom diameter is smaller than a predetermined threshold value; and
  secondly helical chamfer machining a second silicon wafer of the plurality of silicon wafers using the fine grinding grindstone portion having been subjected to the secondly truing so that a finished wafer taper angle of the machined second silicon wafer is within the allowable angle range of the target wafer taper angle,
  wherein the second truer taper angle is larger than the first truer taper angle.

2. The method of helical chamfer machining silicon wafers, according to claim 1, wherein the target wafer taper angle is 23 degrees or less.

3. The method of helical chamfer machining silicon wafers according to claim 1, wherein a difference between the first truer taper angle and the second truer taper angle is equal to or larger than 1 degree.

4. The method of helical chamfer machining silicon wafers, according to claim 1, further comprising adjusting the groove bottom diameter by wearing down the fine grinding grindstone portion.

5. The method of helical chamfer machining silicon wafers according to claim 2, wherein a difference between the first truer taper angle and the second truer taper angle is equal to or larger than 1 degree.

6. The method of helical chamfer machining silicon wafers, according to claim 2, further comprising adjusting the groove bottom diameter by wearing down the fine grinding grindstone portion.

7. The method of helical chamfer machining silicon wafers, according to claim 3, further comprising adjusting the groove bottom diameter by wearing down the fine grinding grindstone portion.

8. The method of helical chamfer machining silicon wafers, according to claim 5, further comprising adjusting the groove bottom diameter by wearing down the fine grinding grindstone portion.

* * * * *